United States Patent [19]

Kroll, Jr. et al.

[11] Patent Number: 4,656,729

[45] Date of Patent: Apr. 14, 1987

[54] DUAL ELECTRON INJECTION STRUCTURE AND PROCESS WITH SELF-LIMITING OXIDATION BARRIER

[75] Inventors: Charles T. Kroll, Jr., Raleigh; Geoffrey B. Stephens, Cary, both of N.C.

[73] Assignee: International Business Machines Corp., Armonk, N.Y.

[21] Appl. No.: 715,318

[22] Filed: Mar. 25, 1985

[51] Int. Cl.[4] .......................................... H01L 21/04
[52] U.S. Cl. ................................. 29/571; 29/576 E; 29/578; 29/591; 357/235; 357/54
[58] Field of Search ............. 29/571, 591, 578, 576 E; 357/23.5, 23.6, 59, 92, 54

[56] References Cited

U.S. PATENT DOCUMENTS

| 4,458,407 | 7/1984 | Hoeg, Jr. et al. | 29/571 |
| 4,471,471 | 9/1984 | DiMaria | 365/149 |
| 4,472,726 | 9/1984 | DiMaria | 357/6 |
| 4,486,859 | 12/1984 | Hoffman | 365/185 |
| 4,535,349 | 8/1985 | Weinberg | 357/23.6 |

OTHER PUBLICATIONS

DiMaria et al, "Electrically-Alterable Memory Using a DEIS" IEEE Electron Device Letters, vol. EDL-1, No. 9, Sep. 1980, pp. 179-181.

Primary Examiner—Brian E. Hearn
Assistant Examiner—Tuan N. Quach
Attorney, Agent, or Firm—Joscelyn G. Cockburn

[57] ABSTRACT

A dual electron injection structure (DEIS) and process for incorporating it into a semi-conductor structure, such as an E2PROM and/or NVRAM, is disclosed. The DEIS includes a composite structure formed from a layer of silicon rich nitride, a layer of silicon dioxide ($SiO_2$) and a layer of silicon rich oxide. Preferably, a Plasma Enhanced Chemical Vapor Deposit (PECVD) method or a low pressure chemical vapor deposit (LPCVD) method is used to place the DEIS between the Poly 1 and Poly 2 devices of the semi-conductor structure.

11 Claims, 12 Drawing Figures

DUAL ELECTRON INJECTION STRUCTURE AND PROCESS WITH SELF-LIMITING OXIDATION BARRIER

BACKGROUND OF THE INVENTION

1. Field of the Invention

The invention relates generally to semi-conductor memory devices. Particularly, the invention relates to Electronically Erasable Programmable Read-Only Memory ($E^2PROM$) or Electrically Alterable Read-Only Memory (EAROM) and to non-volatile random access memory (NVRAM).

2. Prior Art

U.S. Pat. No. 4,458,407 (entitled "Process for Fabricating Semi-Conductive Oxide Between Two Polysilicon Gate Electrodes," filed on Apr. 1, 1983, issued July 10, 1984 to Hoeg et al, and assigned to the assignee of the present invention) sets forth a full description of the prior art and should be referred to for prior art information. The subject patent is incorporated herein by reference.

As is noted in the Hoeg, Jr. et al patent, in fabricating a semiconductive oxide or Dual Electron Injection Structure (DEIS) between two polysilicon electrodes, it is necessary to protect the DEIS from oxidation during the step of growing the gate oxide for the second polysilicon electrode. The DEIS material, as taught by DiMaria (a reference described in the prior art section of the Hoeg et al reference), is a composite of three layers of silicon dioxide which have been chemically vapor deposited such that the bottom and top layers have excess silicon atoms which when placed adjacent to lower and upper conductive electrodes of polysilicon cause a conduction of electrons through the middle silicon dioxide layer at a reduced electric field. The middle layer inhibits the tunneling of charge at lower electric fields and as a result prevents the loss of charge from a floating gate in a non-volatile memory cell. This composite structure readily oxidizes to silicon dioxide during a typical gate oxidation step unless protected by a non-oxidizing layer.

A method for fabricating the DEIS between Poly 1 and Poly 2 devices has been taught in the Hoeg Jr. et al patent. The method uses a layer of silicon nitride to prevent oxidation of the DEIS during the required oxidation step. The Hoeg et al reference also teaches the removal of the silicon nitride layer using a combination of plasma etch and hot phosphoric acid which attacks the exposed gate and insulator layer. The patent also teaches the use of a thin poly X layer as a buffer between the silicon nitride and the DEIS to protect the DEIS from the etching steps.

SUMMARY OF THE INVENTION

It is therefore the object of the present invention to provide an improved DEIS structure and method for laying down said structure in a semi-conductor device.

The process/structure described herein eliminates the need for the $Si_3N_4$ oxidation barrier of the Hoeg Jr. et al patent by altering the DEIS material such that it is self-limiting to oxidation during the required oxidation process step for laying down the Poly 2 gate oxide and Poly 1 - Poly 2 insulation. The oxide layer that is formed on the exposed surface of the new DEIS material is used as the intermediate high barrier material that gives the DEIS its good charge retention characteristics.

Starting in the process sequence after the first layer of polysilicon, Poly 1 has been deposited on a silicon substrate having regions covered with thin oxide regions and thick oxide regions, the first layer of the DEIS is deposited.

This first portion of the DEIS is deposited in a Plasma Enhanced Chemical Vapor Deposition (PECVD) system with the following conditions:

A pressure of 375 microns of mercury is attained with a mixture of 1.5% $SiH_4$ in Argon and 0.4 cc/min. of $O_2$. The chamber is then backfilled to 1800 microns with $N_2$. The substrate is resistively heated to 350° C. and the rf energy is maintained at 125 watts. The deposition time is of the order of 60 seconds to give a deposited thickness of 450° A and refractive index of 1.85.

The composition of this material is silicon oxynitride (silicon rich nitride-SRN) with some unknown proportions of silicon, oxygen and nitrogen with unsatisfied silicon bonds which five a reduced electric field for conduction through the layer.

The first layer of the DEIS is masked with photoresist and etched with hydrofluoric acid buffered 20:1 in NH4F to form the bottom injection layer.

The next mask is used to define the Poly 1 electrode, which serves as the floating gate in a non-volatile memory cell. The thin oxide region is etched back to the silicon substrate, the gate oxide in the etched thin oxide region is regrown in a high temperature steam and oxygen ambient. This step simultaneously grows an insulator oxide region on the exposed surfaces of the Poly 1 region and oxidizes the exposed surfaces of the DEIS region. The bottom layer of the newly formulated DEIS oxidizes in a manner that is self-limiting in thickness of the oxidized region once a minimum time in the oxidizing ambient has been achieved.

For example, the time and temperature needed to grow 450° A on the silicon substrate is adequate to achieve a self-limiting oxidized layer on the DEIS. The thickness of this conduction barrier of silicon oxynitride is determined by the amount of $O_2$ that was added during the deposition of the DEIS layer and extended exposure to the oxidizing ambient does not appreciably affect the thickness or conduction characteristics of the DEIS layer.

The next process step is the deposition of the top injector region which is again performed in the PECVD with identical conditions to the previous deposition with the exception of increasing the $O_2$ in the top injection region is to render this layer readily oxidizable in regions not covered by the second polysilicon layer during a subsequent final oxidation step.

The second polysilicon layer is now deposited and doped with phosphorus using well-known techniques and is masked and etched into patterns to form a top electrode over the DEIS structure as well as electrodes for FET gates and capacitors, and interconnections for integrated circuit elements.

DETAILED DESCRIPTION OF THE INVENTION

Figure 1:
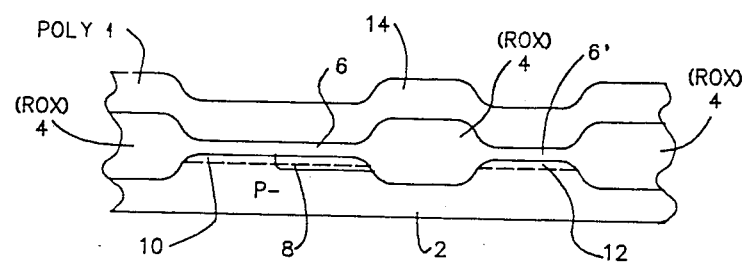
FIGS. 1-6 show in cross-section a sequence of diagrams depicting the novel method and novel E2PROM according to the teachings of the present invention.

FIG. 1 shows a cross-sectional view of a polysilicon gate Field Effect Transistor (FET). The structure is fabricated through the formation of recessed oxide (ROX), gate oxidation, and polysilicon gate deposition process. The process steps utilized to form the structure of FIG. 1 are as follows:

A P-negative silicon substrate 2 is initially oxidized in steam and oxygen to a thickness of approximately 40 nm. The wafer is coated with a 100 nm of silicon nitride using well known chemical vapor deposition (CVD) techniques. This layer is covered with photoresist and patterned to expose portions of the silicon nitride layer to an rf plasma etch which removes the layer over the regions 4, where thick oxide is to be grown. After ion implanting boron through the 40 nm oxide in regions 4 and stripping the photoresist, the wafer is thermally oxidized in steam and oxygen to a thickness of 650 nm in the regions 4. The remaining silicon nitride is then removed in an unmasked etch using 180° $H_3PO_4/H_2SO_4$.

The 40 nm oxide is next removed in buffered HF and the first gate oxide 6, 6' is grown to a thickness of 45 nm. An unmasked boron implant is used to achieve the desired threshold voltage for the field effect transistors (FET's), to be formed in regions 10 and 12. The coupling diffusion 8 is implanted through the oxide 6 using photoresist masked ion implant. The first polysilicon layer 14 is then deposited using CVD at a thickness of 400 nm. Preferably the polysilicon is doped with phosphorous as it is being deposited. The technique described so far is one of the well-known prior art techniques used to deposit a poly 1 layer on a silicon substrate. Of course, other well known techniques may be used without departing from the scope of the present invention.

The structure of FIG. 1 is now processed in accordance with the techings of the present invention. The structure of FIG. 1 is now annealed at 1000° C. in an inert ambient such as nitrogen ($N_2$) to allow the polysilicon layer 14 to partially recrystallize so that the grain size is stable during subsequent hot process steps.

A plasma enhanced chamical vapor deposition (PECVD) technique is used to deposite a 15 nm layer 16 of silicon rich nitride (SRN) and a 10 nm layer 18 of silicon dioxide ($SiO_2$).

The preferred conditions for the silicon rich nitride layer 16 in the PECVD reactor are:

A pressure of 375 microns of mercury is attained with a mixture of 1.5% $SiH_4$ of Argon and 0.4 cc/min. of $O_2$. The chamber is then backfilled to 1800 microns with $N_2$. The reactor substrate is resistively heated to 350° C. and the rf energy is maintained at 125 watts. The deposition time is of the order of 40 seconds to give an as deposited thickness of 225° A and refractive index of 1.85.

The preferred conditions for the deposition of the silicon dioxide layer 18 are:

A pressure of 100 microns of mercury is attained with a mixture of 1.5% $SiH_4$ in Argon and 3.0 cc/min. of $O_2$. The chamber is then backfilled with $N_2$ to 1600 microns. The reactor substrate is resistively heated to 350° C. and the rf energy is maintained at 125 watts. The deposition time is of the order of 80 seconds to give an as deposited thickness of 100° A and refractive index of 1.47.

Figure 2:
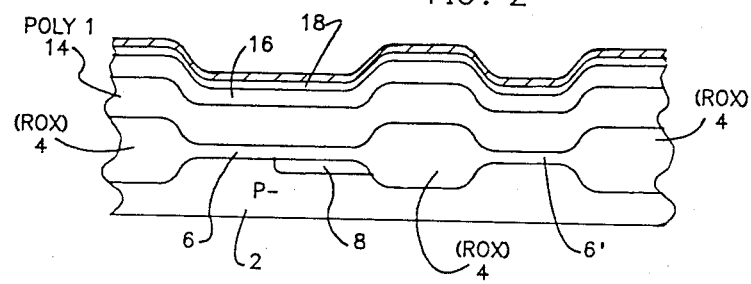
Figure 3:
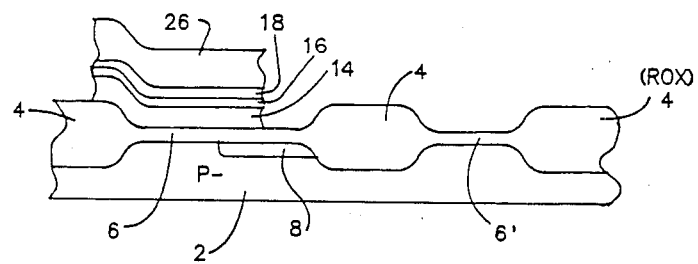

The structure or wafer of FIG. 2 is then patterned with photoresist 26 (FIG. 3). The exposed wafer is then etched in a plasmar etch using DE-100, a proprietary mixture of $CF_4+O_2$ from the Scientific Gas Products Company of South Plainfield, N.J. The mixture etches the deposited $SiO_2$ layer 18', and the deposited SRN layer 16' at 70 nm/minute. The underlying polysilicon layer 14' is etched at a rate of 80 nm/minute in the DE-100 to have a coincident definition with the SRN region 16'. The thermal oxide region 6' etches at 1nm/minute and serves as an etch stop for the definition of the polysilicon layer 14'.

Figure 4:
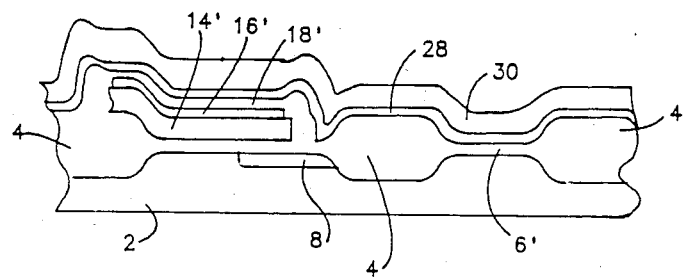

The exposed oxide region 6' is etched back to the silicon surface using buffered HF, the photoresist 26 is stripped and the wafer is thermally oxidized in a steam and oxygen ambient at 800° C. (FIG. 4). The gate oxide 6' is regrown to an approximate value of 45 nm while the field oxide in region 4 grows very little and the polysilicon layer 14' sidewall oxidizes at a faster rate to about 200 nm. The $SiO_2$ layer 18' densifies and the top and sidewall of SRN layer 16' oxidizes slightly to form an oxynitride transition layer to the surrounding oxide but is self-limiting to further oxidation at about 2.5 nm thickness.

A low pressure CVD (chemical vapor deposition) process is then used to deposit a 15 nm layer 28 of silicon rich oxide (SRO), at conditions taught in U.S. Pat. No. 4,458,407 to Hoeg Jr. et al. As stated above, the subject patent is incorporated herein by reference.

A layer of in situ doped polysilicon is then deposited, again using well known LPCVD techniques, to form its second layer of interconnections and gate electrode.

Figure 5:
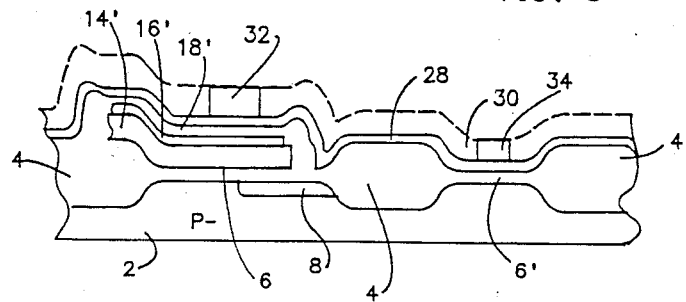

A photoresist is patterned to etch the program/erase electrodes 32 (FIGS. 5 and 6) as well as polygate electrode 34 using DE-100 in an RF plasma. The etch rate of the SRO 28 is much slower (1 nm/min) than the polysilicon layer 30 (80 nm/min) and serves as an etch step in the plasma etch conditions.

After removing the photoresist the source/drain regions 36 and 38 (FIG. 6) and coupling electrode 40 are implanted with arsenic with a thick field oxide region 4 and polysilicon region 14', 34 masking the implant.

Figure 6:
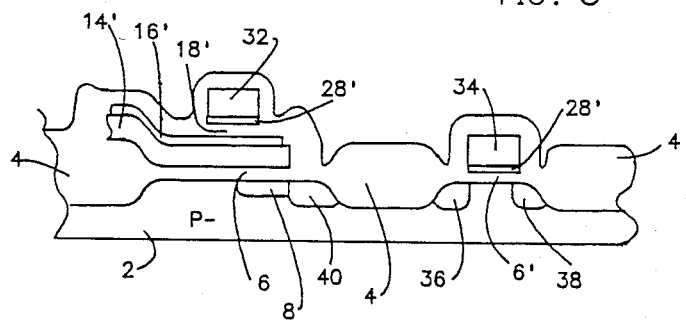

The source/drain diffusions are driven to their final junction depth of 500 nm at 1000° C. in steam and/or oxygen which grows 200 nm of $SiO_2$ over the diffusions and 300 nm of $SiO_2$ over the polysilicon surfaces and sidewalls. The SRO layer 28 where not covered by the poly layer 30 is converted to $SiO_2$. The layers of SRO that are not converted to $SiO_2$ are identified by 28' (FIG. 6).

Figure 7:
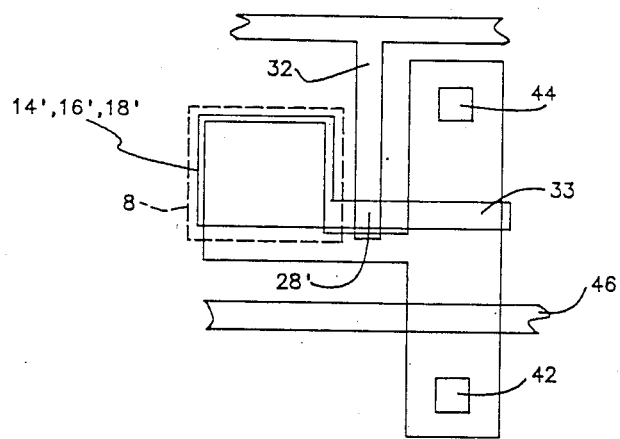
FIG. 7 shows a top view for a single cell of the E2PROM.

Windows (not shown) are then etched in the oxide to make electrical contact to the diffusions and polysilicon electrode. Metal patterns (not shown) are appropriately defined to complete the structure. FIG. 7 shows a top view of the floating gate structure formed from the above described processing steps. In the figure the floating gate channel region 33, the word line 46, the bit line program node 42, and the bit line read node 44 are also depicted.

Figure 8:
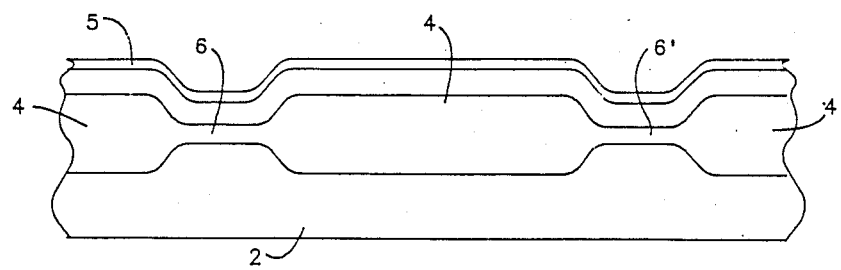
FIGS. 8-12 show, in cross section, a sequence of diagrams depicting an alternate process of forming the DEIS in a semi-conductor module.
Figure 9:
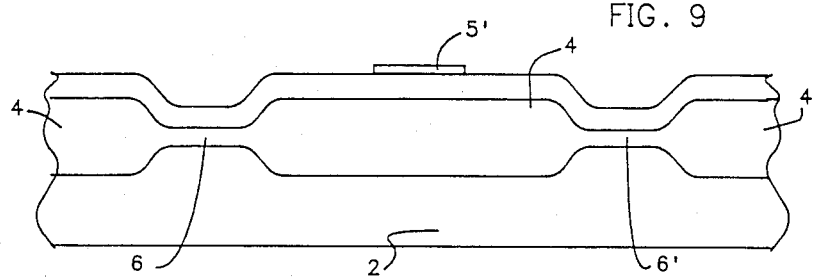
Figure 10:
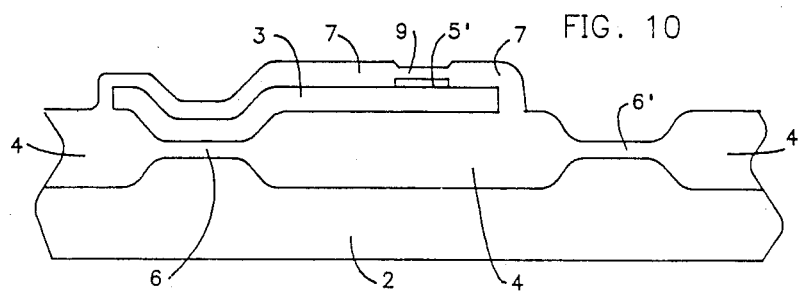
Figure 11:
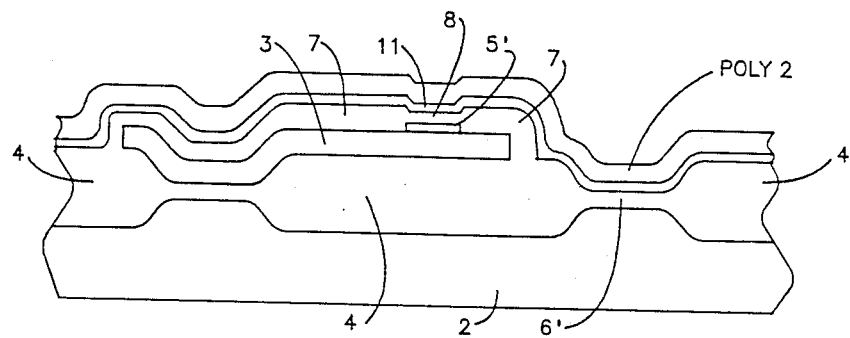
Figure 12:
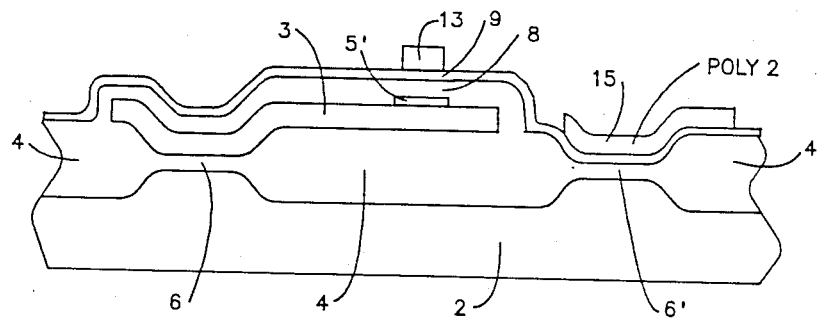

FIGS. 8-12 describe another embodiment of the invention. In the embodiment structures that are similar to previously described structures are identified by common numbers. Starting in the process sequence after the first layer of polysilicon, Poly 1 has been deposited on a silicon substrate 2 having regions covered with thin oxide regions 6, 6' and thick oxide regions 4, the first layer 5 of the DEIS is deposited as shown in FIG. 8.

This first portion of the DEIS is deposited in a Plasma Enhanced Chemical Vapor Deposition (PECVD) system with the following conditions:

A pressure of 375 microns of mercury is attained with a mixture of 1.5% $SiH_4$ in Argon and 0.4 cc/min. of $O_2$. The chamber is then backfilled to 1800 microns with $N_2$. The substrate is resistively heated to 350° C. and the rf energy is maintained at 125 watts. The deposition time is of the order of 60 seconds to give an as deposited thickness of 450° A and refractive index of 1.85.

The composition of this material is silicon oxynitride (silicon rich nitride - SRN) with some unknown proportions of silicon, oxygen and nitrogen with unsatisfied silicon bonds which give a reduced electric field for conduction through the layer.

The first layer of the DEIS is masked with photoresist and etched with hydrofluoric acid buffered 20:1 in $NH_4F$ to form region 5'.

After the next mask is used to define the Poly 1 electrode 3 (FIG. 10), which serves as the floating gate in a non-volatile memory cell, and the thin oxide region 6' is etched back to the silicon substrate, the gate oxide in region 6' is regrown in a high temperature steam and oxygen ambient. This step simultaneously grows the insulator oxide 7 on the exposed surfaces of the Poly 1 region 6 and oxidizes the exposed surfaces of the DEIS region 5'. The newly formulated DEIS oxidizes in a manner that is self-limiting in thickness of the oxidized region since the structure is maintained for a minimum time in the oxidizing ambient. For example, the time and temperature needed to grow 450° A on the silicon substrate is adequate to achieve a self-limiting oxidized layer on the DEIS. The thickness of this conduction barrier of silicon oxynitride 9 (FIG. 10) is determined by the amount of $O_2$ that was added during the deposition of the DEIS layer and extended exposure to the oxidizing ambient does not appreciably affect the thickness or conduction characteristics of the DEIS layer.

The next process step is the deposition of the top injector region 11 (FIG. 11) which is again performed in the PECVD with identical conditions to the previous deposition with the exception of increasing the $O_2$ flow rate to 0.7 cc/min. The purpose of the additional $O_2$ in the top injection region is to render this layer readily oxidizable in regions not covered by the second polysilicon layer during a subsequent final oxidation step.

The second polysilicon layer (Poly 2) is now deposited using well-known in situ doped LPCVD techniques and is masked and etched into patterns (FIG. 12) to form the top electrode 13 over the DEIS structure as well as electrodes for FET gates 15 and capacitors, and interconnections for integrated circuit elements.

It is noted that the top injector layer remains everywhere under the second polysilicon regions. This has two very beneficial effects. First, the increased dielectric constant of this layer improves the capacitance per unit area when the second polysilicon layer is used to form the storage node of a dynamic random access memory cell, and improves the transconductance of FET's formed with poly 2 gates. Secondly, it has been demonstrated that the injector layer has a very beneficial effect on the elimination of low field breakdowns and shorts normally experienced in the fabrication of thin gate oxides. The reason for this latter benefit is that the excess silicon atoms or groups of atoms which are isolated from each other by thin tunneling oxides can take on charge which then screen further injection of charge from defects in the gate oxide-silicon structure.

Alternately, the top injector may be formed as in the prior art where no nitrogen is included in the structure since this layer is to be oxidized in the subsequent oxidation step whenever it is not covered by the second polysilicon regions.

Several benefits inure to the user of the present invention. By utilizing a plasma enhanced CVD process or a low pressure CVD process, the range of control over the structure is improved. Also, a 4 to 1 improvement in cell size was achieved. Finally, an average yield improvement of between 100 to 400% over the prior art technique was achieved.

Having thus described our invention, what we claim and desire to secure by Letters Patent is as follows:

1. A method for incorporating a non-continuous DEIS structure between multiple layers of polysilicon in an array of devices on an integrated circuit substrate comprising the following steps:
    (a) fabricating at least one thin oxide region surrounded by thick oxide regions on a silicon substrate;
    (b) depositing a first polysilicon gate interconnect layer on the substrate;
    (c) depositing a layer of silicon rich nitride on said polysilicon gate interconnect layer;
    (d) patterning a first photoresist mask on the silicon rich nitride layer with said photoresist mask defining a profile for the silicon rich nitride;
    (e) etching the uncovered areas of the silicon rich nitride;
    (f) patterning a second mask on the first polysilicon gate interconnect layer with said second mask defining a profile for the first polysilicon gate interconnect layer;
    (g) etching the uncovered areas of the first polysilicon gate interconnect layer;
    (h) etching back the thin oxide region in step (a) to the silicon substrate;
    (i) growing an oxide layer of sufficient thickness on the silicon rich nitride, the first polysilicon gate interconnect layer and oxidizing the silicon substrate of step (h);
    (j) depositing a layer of silicon rich oxide on the oxide layer of step (i);
    (k) depositing a second polysilicon layer on the silicon rich oxide of step (j); and
    (l) patterning the second polysilicon layer of step (k) to form at least one gate electrode.

2. The method of claim 1 wherein the silicon rich nitride layer of step (c) is being deposited in a plasma enhanced chemical vapor deposition (PECVD) system.

3. The method of claim 2 wherein the PECVD system includes the conditions of:
    (a) a pressure of 375 microns of mercury, said pressure being attained with a mixture of 1.5% $SiH_4$ in argon and 0.4 cc/min. of $O_2$;
    (b) backfilling the chamber to 1800 microns with $N_2$; and
    (c) resistively heating the substrate to 350° C. and the rf energy is being maintained at 125 watts.

4. The method of claim 2 further including a deposition time in the order of 60 seconds to give a deposit thickness of approximately 450° A and refractive index of 1.85.

5. The method of claim 1 wherein the silicon rich oxide layer of step (j) is being deposited by e PECVD system having the conditions of:
   (a) a pressure of 375 microns of mercury, said pressure being attained with a mixture of 1.5% $SiH_4$ in argon and 0.7 cc/min. of $O_2$;
   (b) backfilling the chamber to 1800 microns with $N_2$; and
   (c) resistively heating the substrate to 350° C. and the rf energy is being maintained at 125 watts.

6. A method for fabricating an improved semi-conductor module comprising the steps of:
   (a) providing a silicon substrate having at least one thin oxide region thereon;
   (b) depositing a first polysilicon gate interconnecting layer on the substrate;
   (c) depositing a silicon rich nitride (SRN) layer on the first polysilicon gate interconnecting layer;
   (d) depositing a silicon dioxide ($SiO_2$) layer on the SRN layer;
   (e) masking the $SiO_2$ layer;
   (f) etching the unmasked section of the SRN layer, the $SiO_2$ layer and the unmasked section of first polysilicon gate layer;
   (g) etching back the thin oxide region of step (a) to the silicon substrate;
   (h) stripping the mask in step (e);
   (i) thermally oxidizing the module;
   (j) depositing a layer of silicon rich oxide on the $SiO_2$ layer of step (d);
   (k) depositing a second polysilicon gate interconnecting layer on the silicon rich oxide layer in step (j); and
   (l) generating gate electrode and poly 2 devices in said interconnecting layer of step (k).

7. The method of claim 6 wherein the silicon rich nitride layer is approximately 15 nm.

8. The method of claim 7 wherein the $SiO_2$ layer is approximately 10 nm.

9. The method of claim 8 wherein the $SiO_2$ layer is being formed by a PECVD system.

10. The method of claim 9 wherein the PECVD system includes the condition of:
    (a) a pressure of 100 microns of mercury being attained with a mixture of 1.5% $SiH_4$ in argon and 3.0 cc/min. of $O_2$;
    (b) back filling the chamber with $N_2$ to 1600 microns; and
    (c) resistively heating the substrate to 350° C. with an rf energy being maintained at approximately 125 watts.

11. The method of claim 9 further including the conditions of utilizing a deposition time of approximately 80 seconds thereby giving a deposited thickness of 100° A and refractive index of 1.47.

* * * * *